United States Patent [19]

Kimura et al.

[11] Patent Number: 4,833,728
[45] Date of Patent: May 23, 1989

[54] AUTOMATIC STATION SEARCHER

[75] Inventors: Hiroyuki Kimura; Mitsuo Syoji, both of Saitama, Japan

[73] Assignee: Pioneer Electronic Corporation, Tokyo, Japan

[21] Appl. No.: 102,923

[22] Filed: Sep. 30, 1987

[30] Foreign Application Priority Data

Sep. 30, 1986 [JP] Japan .................................. 61-232570
Sep. 30, 1986 [JP] Japan .................................. 61-232572
Sep. 30, 1986 [JP] Japan .................................. 61-232573

[51] Int. Cl.$^4$ ................................................. H03J 7/18
[52] U.S. Cl. ..................................... 455/166; 455/184; 455/186
[58] Field of Search ............... 455/166, 175, 185, 186, 455/184, 165

[56] References Cited

U.S. PATENT DOCUMENTS

| 4,232,395 | 11/1980 | Yokogawa | 455/175 X |
| 4,236,251 | 11/1980 | Ohgishi et al. | 455/186 X |
| 4,298,851 | 11/1981 | Shichijo et al. | 455/185 X |
| 4,491,975 | 1/1985 | Ito | 455/166 |
| 4,509,203 | 4/1985 | Yamada | 455/166 |
| 4,525,866 | 6/1985 | Templin | 455/186 |
| 4,561,112 | 12/1985 | Ridder | 455/166 |

FOREIGN PATENT DOCUMENTS 57-186821 11/1982 Japan .
57-212819 12/1982 Japan .

Primary Examiner—Robert L. Griffin
Assistant Examiner—Ralph E. Smith
Attorney, Agent, or Firm—Sughrue, Mion, Zinn, Macpeak & Seas

[57] ABSTRACT

An automatic station searching device for a radio receiver in which the order in which the station data is stored in a memory device can be altered so that the user can easily selected between storage in the order of signal strength or storage in the order of frequency. Frequency and signal strength data for received stations are stored in order of signal strength during the sweeping operation. At the end of the sweeping operation, the data are rearranged in order of frequency if a memory bit has been set to so indicate.

9 Claims, 6 Drawing Sheets

AUTOMATIC STATION SEARCHER

BACKGROUND OF THE INVENTION

The present invention relates to an automatic station searcher for a receiver, and particularly relates to a receiver in which data on broadcasting stations whose received electric field intensities are higher are stored with priority in a presetting storage section.

A tuner capable of preset tuning is known having an automatic station search function wherein frequency sweeping such as scanning is carried out. The sweeping is temporarily stopped when a sufficiently strong signal is found, the frequency of the received signal is stored in a storage section, and sweeping is then resumed to find other signals. However, it is likely that in an urban area or the like where the electric field intensities of received broadcasting stations are relatively high, the number of received broadcasting stations will exceed the capacity of the presetting storage section before the end of the automatic station search operation. Hence, some broadcasting stations at higher frequencies, for example, may not be preset in the storage section.

An automatic station search system has been proposed in which data concerning received broadcasting stations having higher electric fields intensities are stored with priority in a presetting storage section, thus eliminating the above-mentioned drawback. Such a system is disclosed in Japanese Unexamined Published Patent Application No. 186821/82. Such a conventional automatic station search system will hereafter be described with reference to FIG. 1.

Referring to FIG. 1 a superheterodyne receiver includes an antenna 1, a front end (radio frequency stage) 2, an intermediate frequency stage 3, a detector stage 4, an audio amplifier 13, and a phase-locked loop 5. The frequency division ratio of the phase-locked loop 5 can be set by a control section 9 to receive a station of a desired frequency. The output from the intermediate frequency stage 3 is converted into a DC level (SL) by a level detector circuit 6. The DC level is compared with a reference voltage by a level comparator circuit 7. When the DC level is higher than the reference voltage, the DC level is converted into a digital value (DSL) by an A/D converter 8. The digital value is applied to the control section 9.

A storage section 11 is connected to the control section 9. Data $M_1-M_n$ (such as frequency information) 11b and the digital values (DSL) 11a (such as signal strength values) for a prescribed number of received stations are stored in the storage section 11. The control section 9 regulates the writing and reading of the data into and from the storage section 11.

Presetting keys $P_1-P_n$ correspond to the data $M_1-M_n$ stored in the storage Section 11. One of the preset keys $P_1-P_n$ is operated to send a control signal from the control section 9 to the phase-locked loop 5 on the basis of the frequency information of the corresponding data to receive the broadcasting station of the specified frequency.

When a station search command section 10 commands the control section 9 to start an automatic station search operation, the control section issues a sweep command to the phase-locked loop 5. As a result, the phase-locked loop 5 performs sequential sweeping within the specified frequency band. The received signal from the output of the intermediate frequency stage 3 is converted to a DC level (SL) by the level detector 6. The DC level is compared with the reference voltage. When the DC level is higher than the reference voltage, the DC level is converted into the digital value (DSL) by the A/D converter 8. The DC level is then stored together with the frequency information at a prescribed position in the storage section 11. The seqential sweeping operation is then continued to repeat such operation.

Digital value (DSL) already stored in the storage section 11 corresponding to received stations and newly generated digital values corresponding to stations currently being received are compared with each other and the DC levels are sequentially stored in the order of the magnitudes of the corresponding digital values.

If the received frequency band contains frequencies of broadcasting stations as shown in FIG. 1, the DC levels for the stations are ranked in the order of G, B, A, F and C, although the digital values for the stations should be 5, 4, 3, 2 and 1, for instance. That is, the order of the data of received station information stored in the storage section 11 through such an operation corresponds to that of the intensities of the electric field strength of the received stations.

Another conventional automatic station search system, one in which data on received stations having higher intensities of electric fields are stored with priority similarly to the above conventional automatic station search system but in the order of the frequencies of the stations, has been disclosed in Japanese Unexamined Published Patent Application No. 212819/82.

Although the data on the preset received stations are stored in the order of the electric field strengths or in the order of the frequencies thereof in the conventional automatic station search systems described above, there is a disadvantage in that the user cannot preset the received stations in an optional order. Since the data on the preset received stations are not arranged in relation to the frequencies in the system in which the data are stored in the order of the electric field strengths, there is a practical inconvenience in that the user cannot know which preset button the broadcasting station he wants to receive corresponds to.

SUMMARY OF THE INVENTION

The present invention has been made in order to eliminate the above-mentioned disadvantages.

The present invention provides a receiver in which received station data stored in a storage section can optionally be rearranged in the order of the frequencies of the received stations or in the order of the electric field strengths thereof when an automatic station search command is issued during an automatic station search.

Further, the invention provides a receiver in which received station data stored in a storage section can be optionally rearranged in the order of the frequencies of the received stations or in the order of the electric field strengths thereof when an automatic station search command is issued during an automatic station search, and a display device is provided which is driven to enable the user to know the order in which the preset stations are stored.

In each of the receivers provided in accordance with the present invention, it can be arbitrarily chosen whether the received station data stored in the storage section is arranged in the order of the frequencies of the received stations or in the order of the electric field strengths thereof. The operation for making the choice is very simple. Since it is not necessary to provide a switch or the like for instructing which ordering scheme to use, no additional space inside the receiver is required to accommodate extra components.

DESCRIPTION OF PREFERRED EMBODIMENTS

Preferred embodiments of the present invention will hereafter be described in detail with reference to the attached drawings. The same elements of the receivers of the present invention as those of the above-described prior art are indicated by like reference numbers and will not be described in further detail hereinafter.

In each of the inventive receivers, received stations are initially preset in the order of their electric field strengths as determined through an automatic station search operation.

Figure 1:
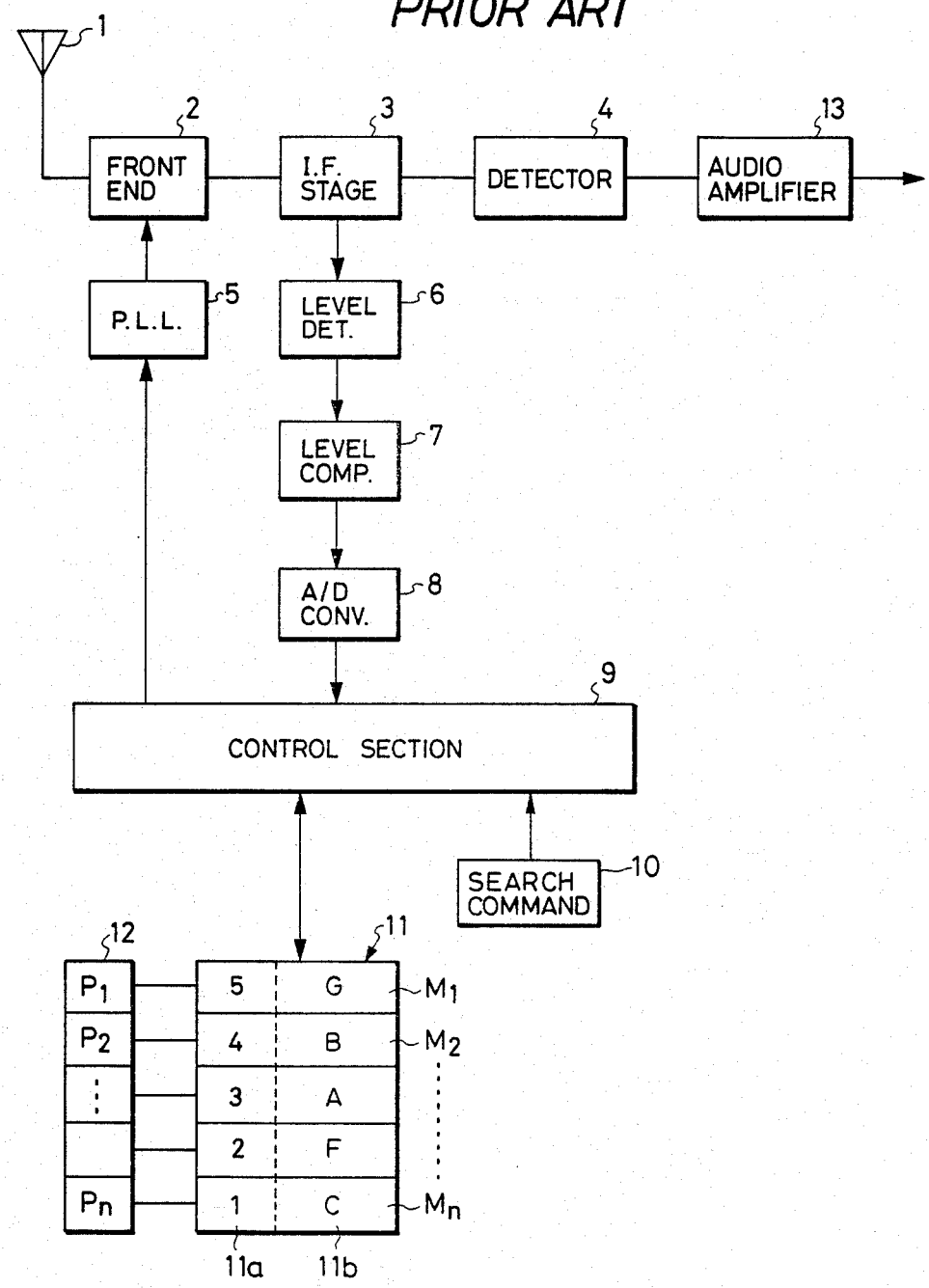
FIG. 1 is a block diagram of a conventional receiver having an automatic station search function.
Figure 2:
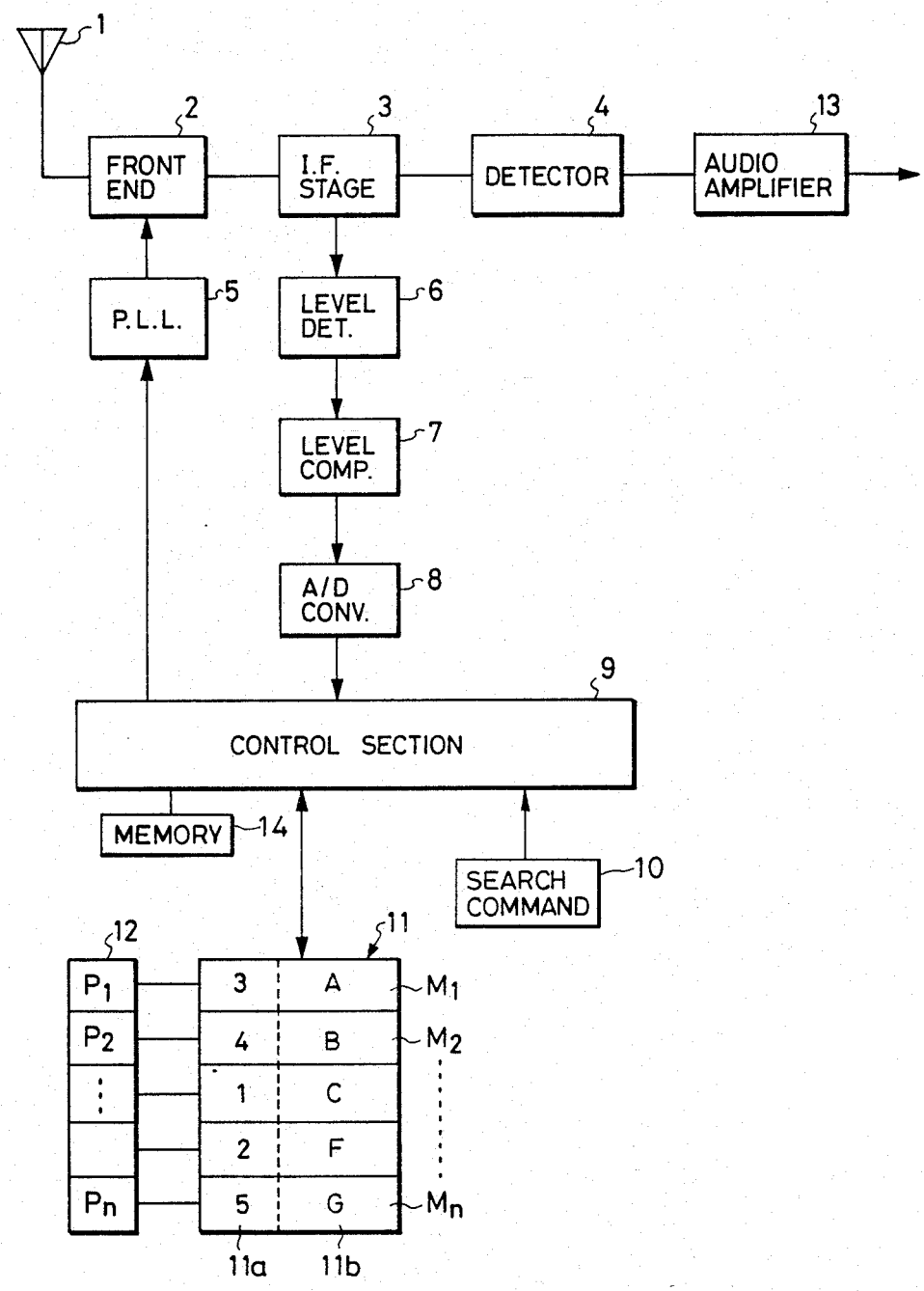
FIG. 2 is a block diagram of a first embodiment of a receiver of the invention having an automatic station search function.

FIG. 2 shows the first embodiment. When a control section 9 is supplied with a station search command from a station search command section 10, the control section clears a memory 14 and stores data on the received stations in the order of the intensities of their electric field strengths in a storage section 11 while performing the prescribed automatic station search. The memory 14 may be included in the control section 9 or connected thereto from the outside.

The station search command section 10 is thereafter operated again during the automatic station search operation so that the control section 9 writes a "1" into the memory 14. The control section 9 continues to perform the automatic station search.

When the control section 9 has completed the automatic station search, the control section refers to the content of the memory 14. At that time, if the content of the memory 14 is a "1", the control section 9 operates to rearrange the received station information stored in the storage section 11 in the order of the received frequencies of the stations. After the rearrangement operation, the control section 9 clears the memory 14. If the memory 14 is already clear, the control section 9 completes the automatic station search without clearing the memory.

Figure 6:
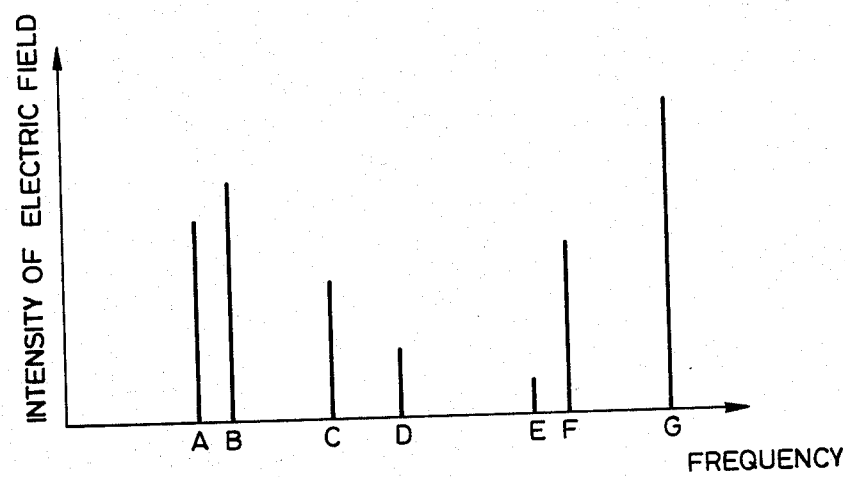
FIG. 6 is a graph of the relation between the frequency of each of broadcasting stations within a reception band and the intensity of the electric field of the stations.

As a result, if the received stations are present within a reception band as shown in FIG. 6, the data on the five received stations having the higher intensities of electric fields and chosen by the ordinary automatic station search are rearranged in the order of their frequencies as A, B, C, F and G in the storage section 11.

When the station search command section 10 is operated plural times during the automatic station search, the content of the memory 14 is rewritten each of the times. In other words, if the memory 14 is already clear, "1" is written into it. If "1" is already stored in the memory 14, the "1" is cleared. For that reason, if the number of times of operation of the station search command section 10 is odd, the content of the memory 14 will always be "1", and if the number of times is even, the content of the memory 14 will be cleared to "0" at the end of the search.

In the first embodiment, the control section 9 is provided with the memory 14 as a means for judging when the automatic station search command section 10 is operated again during the automatic station search.

Figure 3:
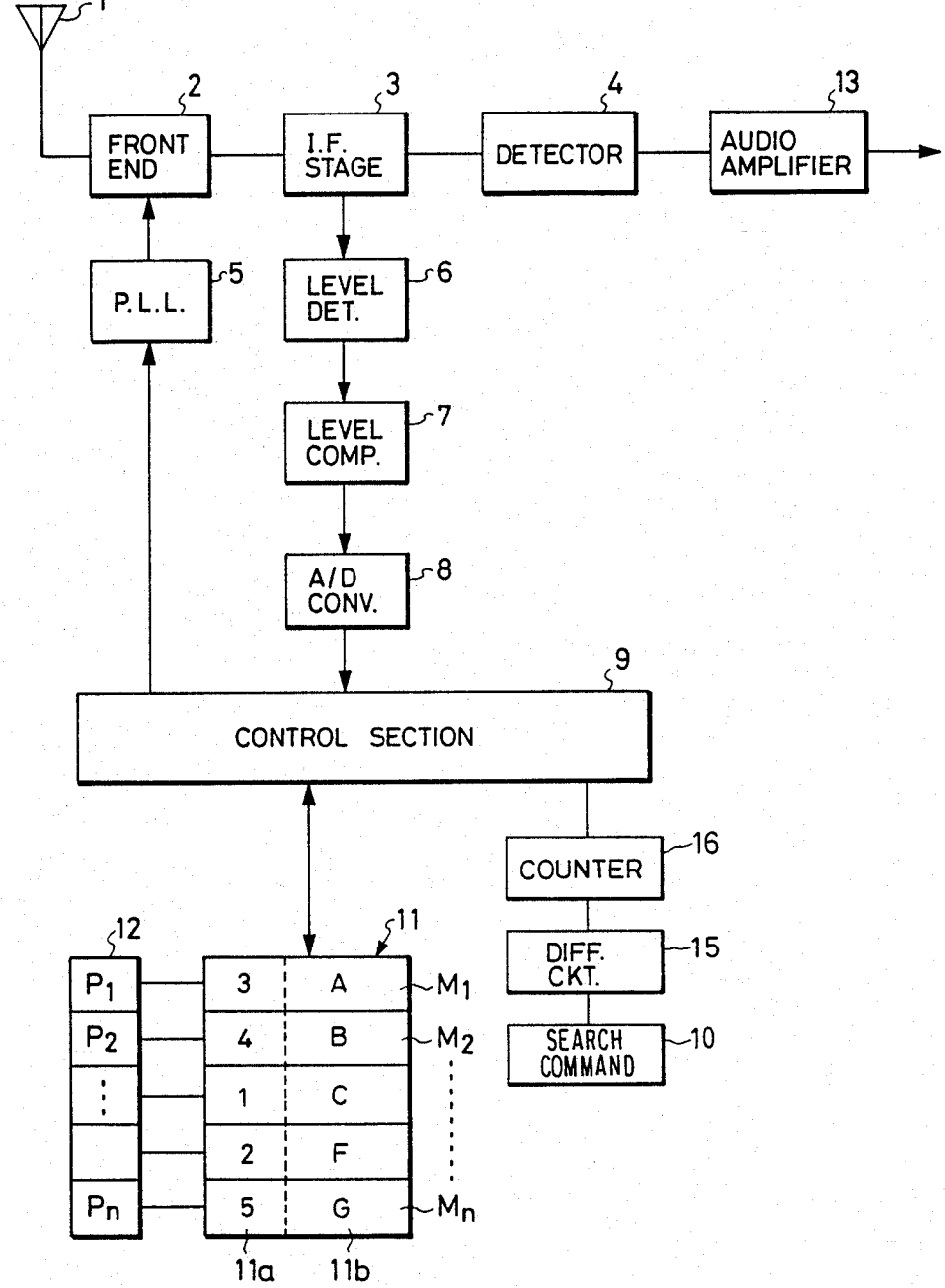
FIG. 3 is a block diagram of a second embodiment of the present invention of a receiver having an automatic station search function.

FIG. 3 shows a second embodiment in which a differentiation pulse output circuit 15 is provided on the output side of a station search command section 10 and the number of times of generation of differentiation pulses is counted by a counter 16 to determine whether a station search command is a first one or a second one. In the second embodiment, if the number of times of generation of the differentiation pulses by the circuit 15, as counted by the counter 16 while the search command section 10 is operated plural times dring an automatic search, is odd, the contents of the storage section 11 are rearranged in the order of the frequencies of received stations. If the number of times of generation of the differentiation pulses by the circuit 15 is even, the contents of the storage section 11 are rearranged in the order of the electric field strengths of the received stations.

Figure 4:
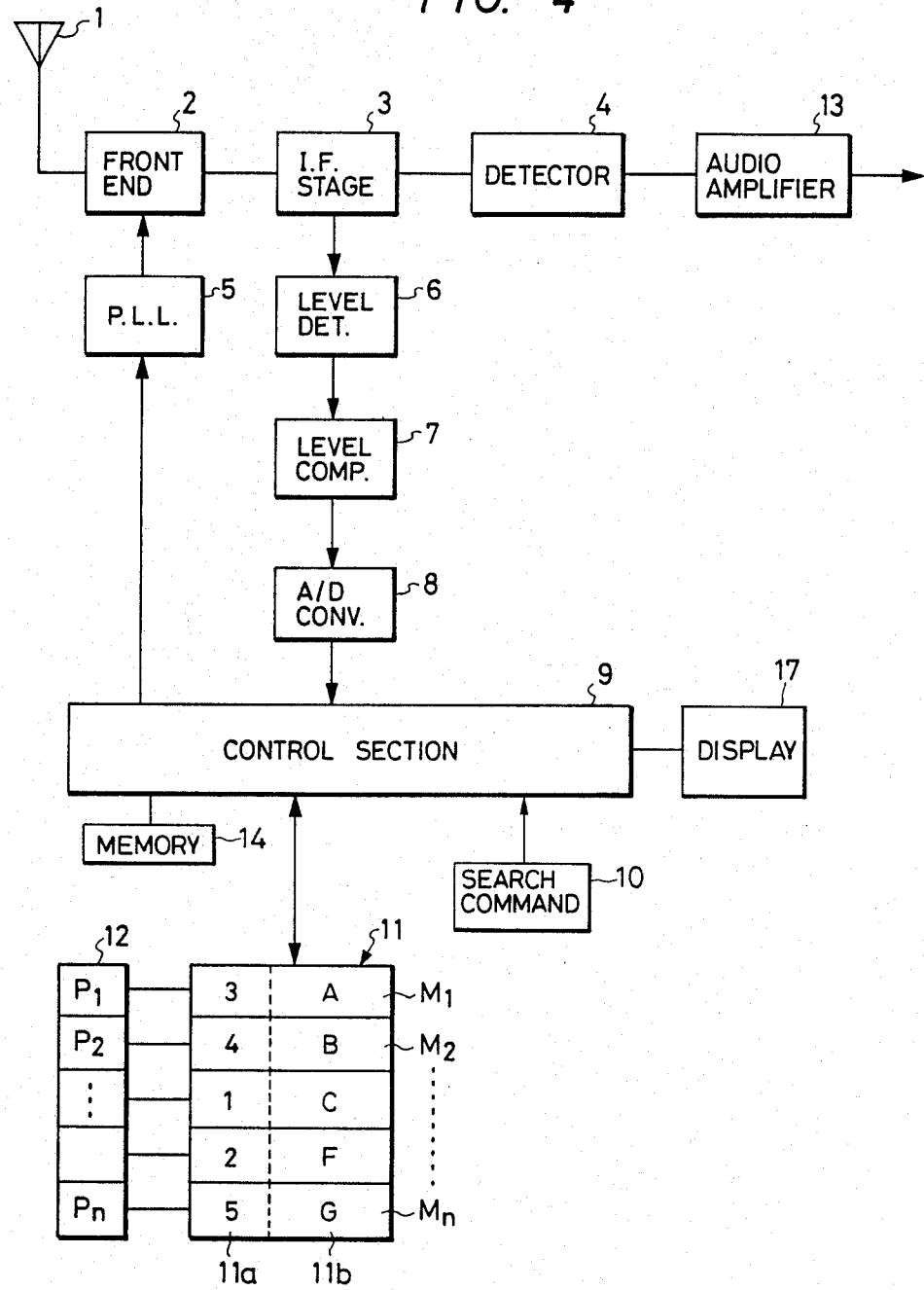
FIG. 4 is a block diagram of a third embodiment of the present invention of a receiver having an automatic station search function.

FIG. 4 shows a third embodiment in which a display 17 is provided to show whether the preset stations are arranged order of their frequencies or the order of their electric field strengths. When a control section 9 is supplied with a station search command from a station search command section 10, the control section clears the memory 14, drives the display 17, which may be a light-emitting device such as a light-emitting diode or fluorescent display tube, and stores data on the received stations in the order of their electric field strengths in a storage section 11 while performing a prescribed automatic search. At that time, with respect to the display device 17, a single light-emitting diode can be continuously lit or a two-colored light-emitting diode can be lit in one color, for example.

When the search command section 10 is thereafter operated again during the automatic station search, the control section 9 writes a "1" into the memory 14 and drives the display 17 in a display mode different from the preceding one. For example, a light-emitting diode can be turned on and off, or a two-colored light-emitting diode switched to another color.

In the third embodiment, the display 17 is provided to determine when the search command section 10 should be operated again during automatic station search.

Figure 5:
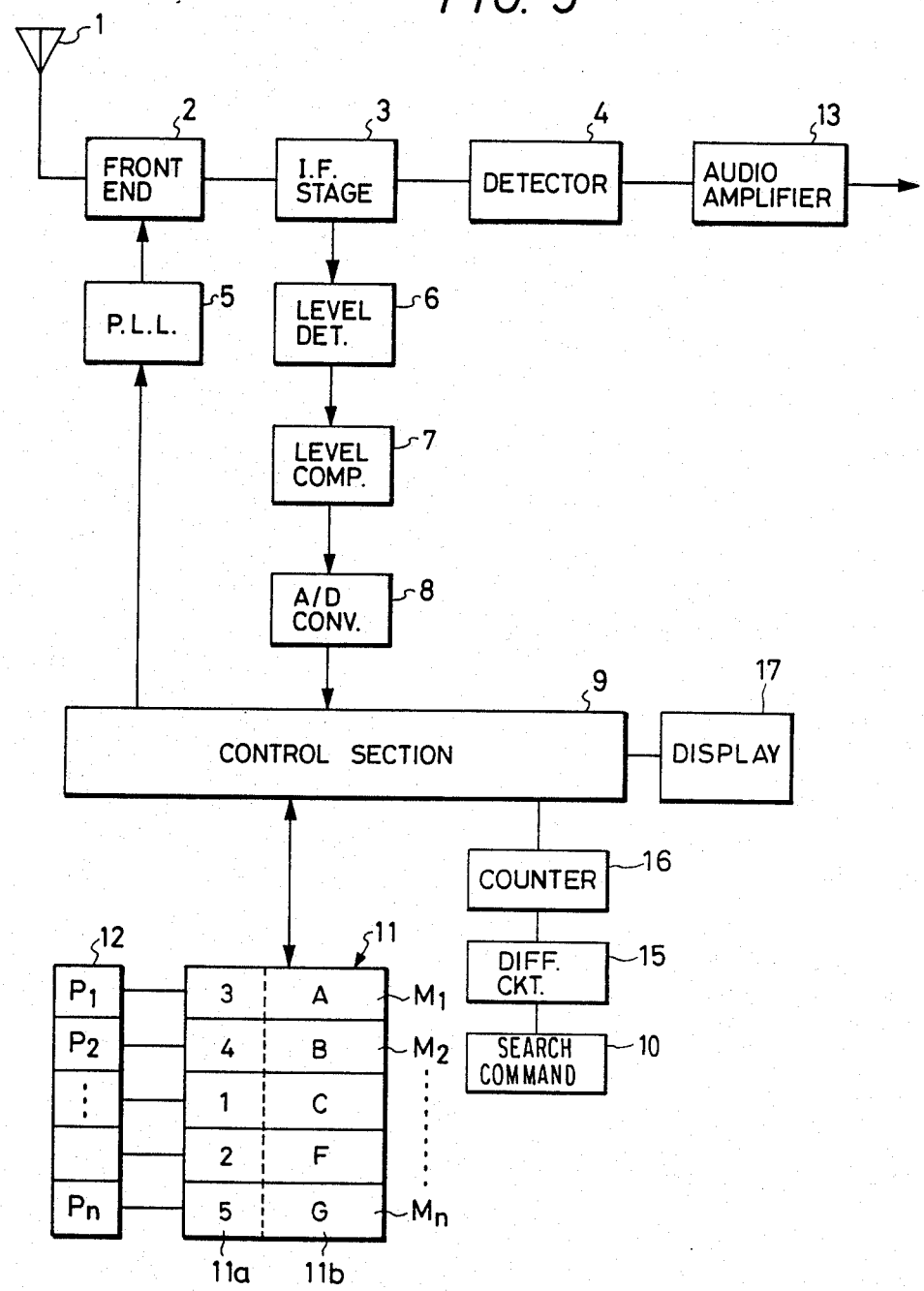
FIG. 5 is a block diagram of a fourth embodiment of the present invention of a receiver having an automatic station search function.

FIG. 5 shows a fourth embodiment in which a differentiation pulse output circuit 15 is provided on the output side of a station search command section 10, the number of times of generation of differentiation pulses by the circuit 15 is counted by a counter 16 to determined whether a station search command is a first one or a second one, and a display 17, which is the same as that in the third embodiment, is provided.

Although all the above-described embodiments are receivers in which data on received stations are stored in the order of the electric field strengths thereof as a result of an automatic station search, the present invention is not limited thereto but may be otherwise embodied as a receiver in which data on received stations are arranged in the order of their frequencies as a result of an automatic station search and a control section is provided with a sorting circuit for rearranging the data on the received stations in the order of the electric field strengths thereof when the contents of the memory is "1".

What is claimed is:

1. In an automatic station searcher for a receiver comprising: means for automatically sweeping within a received frequency band in response to a station search command signal as broadcasting stations are received, and means for storing data, obtained during sweeping, on received broadcasting stations having higher intensities of electric fields with priority in a presetting storage section, the improvement comprising: station search commmand signal generating means for producing said station search command signal; and a control section for determining if said command signal from said generating means has been produced during sweeping, said control section comprising means for rearranging, after sweeping is completed, data stored in said presetting storage section into a prescribed order in response to a determination by said control section that said command signal has been produced during sweeping.

2. The automatic station searcher according to claim 1, further comprising means for attaining at least one of first and second states in response to the determination by said control section that said command signal has been produced during sweeping, wherein said control section rearranges said data depending on the state of said means for attaining.

3. The automatic station searcher according to claim 2, wherein said at least first and second states indicate whether a number of times of production of said command signal during sweeping is odd or even, and said control section rearranges said data stored in said presetting storage section when the number of times of production of said station search command signal during the sweeping is odd.

4. The automatic station searcher according to claim 2, further comprising display means driven by said control section during said sweeping, said control section switching said display means between different display modes indicative of the state of said means for attaining when said station search command signal is produced during said sweeping.

5. The automatic station search of claim 2, wherein said means for attaining comprises one of a memory and a counter.

6. The automatic station searcher of claim 1, wherein said prescribed order is in increasing frequency.

7. An automatic station searcher for a receiver comprising:
    means for automatically sweeping within a received frequency band in response to a first production of a station search command signal as broadcasting stations are received;
    means for storing data, obtained during sweeping, on received broadcasting stations having higher intensities of electric fields with priority in a presetting storage section;
    station search command signal generating means for producing said station search command signal; and
    a control section for determining when said command signal from said generating means is produced during sweeping, said control section comprising means for attaining at least one of first and second states in response to production of said command signal during sweeping, and means for rearranging, after sweeping is completed, data stored in said presetting storage section into a prescribed order depending upon the state of said means for attaining.

8. The automatic station searcher of claim 7, wherein said means for attaining comprises one of a memory and a counter.

9. The automatic station searcher of claim 7, wherein said prescribed order is in increasing frequency.

* * * * *